United States Patent
Greim et al.

(10) Patent No.: US 7,498,815 B2
(45) Date of Patent: Mar. 3, 2009

(54) ARRAY ANTENNA FOR MAGNETIC RESONANCE APPLICATIONS

(75) Inventors: Helmut Greim, Adelsdorf (DE); Martin Hemmerlein, Bamberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/950,655

(22) Filed: Dec. 5, 2007

(65) Prior Publication Data

US 2008/0143333 A1    Jun. 19, 2008

(30) Foreign Application Priority Data

Dec. 14, 2006   (DE) .................. 10 2006 059 137

(51) Int. Cl.
*G01V 3/00* (2006.01)
(52) U.S. Cl. ...................................... 324/318; 324/322
(58) Field of Classification Search ......... 324/300–322; 600/407–422
See application file for complete search history.

(56) References Cited

U.S. PATENT DOCUMENTS

| | | | | |
|---|---|---|---|---|
| 6,060,882 A | * | 5/2000 | Doty | 324/318 |
| 6,842,003 B2 | * | 1/2005 | Heid et al. | 324/318 |
| 2004/0124840 A1 | | 7/2004 | Reykowski | |

FOREIGN PATENT DOCUMENTS

GB    2 151 791 A    7/1985

* cited by examiner

*Primary Examiner*—Brij B Shrivastav
(74) *Attorney, Agent, or Firm*—Schiff Hardin LLP

(57) ABSTRACT

An array antenna for magnetic resonance applications has at least one first and one second conductor loop in which radio-frequency currents oscillate in respective current flow directions in the operation of the array antenna. The respective conductor loops are divided into first or second loop segments in their respective current flow directions. The first loop segments are capacitively coupled with one another by first capacitors, the second loop segments are capacitively coupled with one another of second capacitors. The loop segments are fashioned as conductor traces of a circuit board that has at least one first and one second electrically insulating support layer. The support layers abut one another with the exception of conductor traces arranged between the first support layer and the second support layer. The capacitors are respectively formed by end regions of the first or second loop segments abutting one another as viewed in the respective current flow direction. The end regions overlap as viewed in the respective current flow direction. Exactly one of the support layers is between the overlapping end regions of the loop segments. The first and the second conductor loops intersect in intersection regions. Neither the a loop segments of the first conductor loop nor a loop segments of the second conductor loop are arranged between the first support layer and the second support layer in the intersection regions.

9 Claims, 3 Drawing Sheets

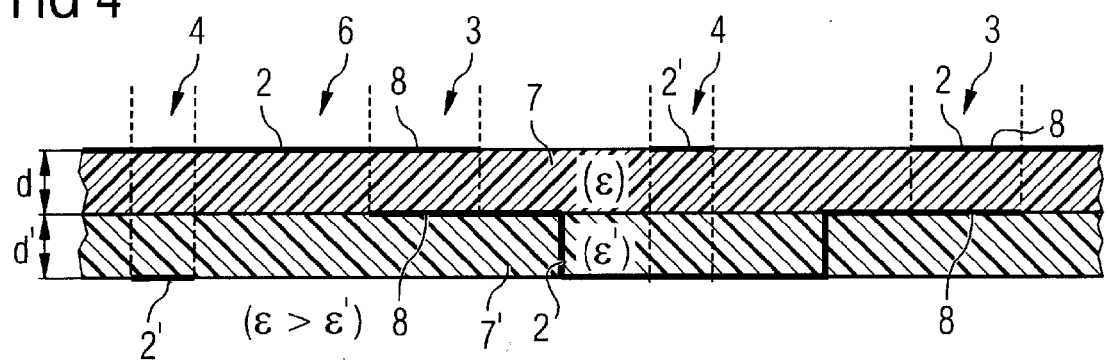
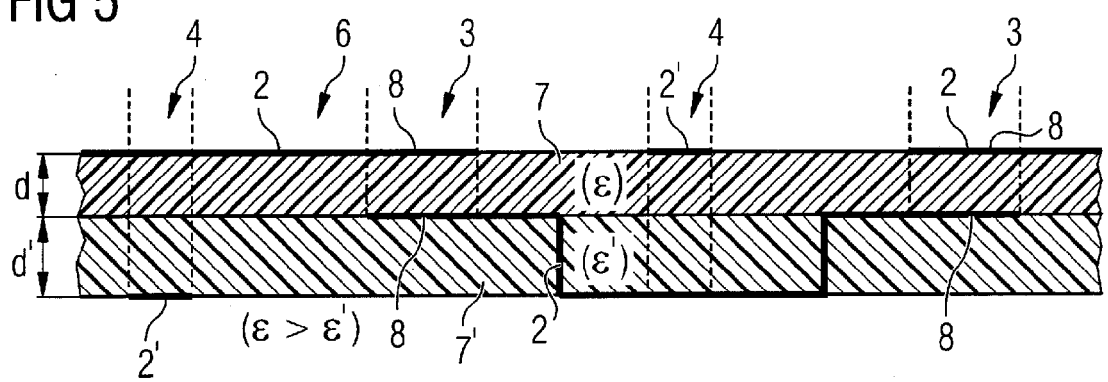
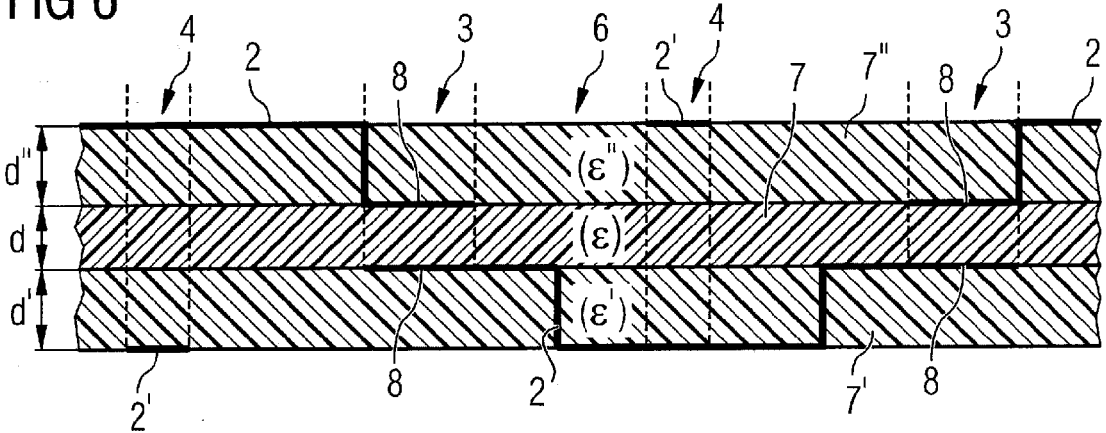

ARRAY ANTENNA FOR MAGNETIC RESONANCE APPLICATIONS

BACKGROUND OF THE INVENTION

1. Field of the Invention

The present invention concerns an array antenna for magnetic resonance applications.

2. Description of the Prior Art

An array antenna is known from DE 102 44 172 A1 having at least one first and one second conductor loop in which radio-frequency currents oscillate in respective current flow directions in the operation of the array antenna, wherein the first conductor loop is divided into first loop segments in its current flow direction and the second conductor loop is divided into second loop segments in its current flow direction, whereby the first loop segments are capacitively coupled with one another by means of first capacitors and the second loop segments are capacitively coupled with one another by second capacitors, wherein the first and the second loop segments are fashioned as conductor traces of a circuit board that has at least one first and one second electrically insulating support layer, and wherein the first and the second conductor loops cross in intersection (junction) regions. In such known arrays the capacitors are normally fashioned as discrete structural elements that are connected with the loop segments, for example by solder. They can be arranged on boards known as capacitor boards (C-boards).

An antenna for magnetic resonance applications that has a first conductor loop and a second conductor loop is known from GB 2 151 791 A. In operation of the antenna radio-frequency currents oscillate in respective current flow directions in the conductor loops. The conductor loops are fashioned as conductor traces of a circuit board. A capacitor is formed by end regions of the conductor traces. For this purpose the end regions overlap, and an electrically insulating support layer is arranged between the overlapping end regions.

The conductor loops must exhibit a high electric strength relative to one another. In order to achieve this electric strength and to avoid a breakdown (arcing), the conductor loops must exhibit a sufficiently large distance from one another in the intersection segments. In the prior art this is normally achieved by metal brackets (for example made from aluminum) that are manually soldered onto the antenna in an additional step.

The procedure of the prior art is cumbersome and time-intensive due to the required manual activities, and error-prone.

SUMMARY OF THE INVENTION

An object of the present invention is to provide an array antenna for magnetic resonance applications that can be manufactured more simply.

Due to the intersecting loop segments of the conductor loops, a parasitic capacitive coupling exists between the intersecting loop segments in the intersection regions. A further object of the present invention is to minimize this (in principle unavoidable) parasitic coupling.

The objects are achieved by an array antenna for magnetic resonance applications according to the invention wherein, in array antenna of the type described above, the first support layer and the second support layer abut one another with the exception of conductor traces arranged between the first support layer and the second support layer, the first capacitors are formed by end regions of first loop segments abutting one another as viewed in their current flow direction, the second capacitors by end regions of second loop segments abutting one another as viewed in their current flow direction, and the end regions overlap as viewed in the respective current flow direction. Exactly one of the support layers is arranged between the overlapping end regions of the loop segments. Neither a loop segment of the first conductor loop nor a loop segment of the second conductor loop are arranged between the first support layer and the second support layer in the intersection regions.

It is possible that, with regard to at least one of the capacitors, the first support layer is arranged between the overlapping end regions of the loop segments and that, with regard to at least one other of the capacitors, the second support layer is arranged between the overlapping end regions of the loop segments. In this case the first support layer and the second support layer advantageously exhibit identical thicknesses and identical relative permittivities. However, the first support layer is normally always arranged between the overlapping end regions of the loop segments.

The first support layer exhibits a first thickness and a first relative permittivity. The second support layer exhibits a second thickness and a second relative permittivity. In the event that the first support layer is always arranged between the overlapping end regions of the loop segments, it is possible without further measures that the second thickness is greater than the first thickness. Alternatively or additionally, it is possible that the second relative permittivity is smaller than the first relative permittivity. The unavoidable parasitic coupling of the first and the second conductor loops in the intersection regions can be even further reduced via these measures.

The parasitic coupling of the conductor loops with one another can be even further reduced in an embodiment wherein the circuit board has a third electrically insulating support layer in addition to the first and second support layers, the first and the third support layers abut one another with the exception of conductor traces arranged between the first and the third support layer, and neither a loop segment of the first conductor loop nor a loop segment of the second conductor loop are arranged between the first support layer and the third support layer in the intersection regions.

Analogous to the first support layer and the second support layer, the third support layer exhibits a third thickness and a third relative permittivity. Analogous to the second support layer, the third thickness can also be greater than the first thickness. Alternatively or additionally, the third relative permittivity can be smaller than the first relative permittivity.

BRIEF DESCRIPTION OF THE DRAWINGS

FIGS. 2 through 8 respectively show different embodiments of a circuit board in the inventive array antenna.

DESCRIPTION OF THE PREFERRED EMBODIMENTS

Figure 1:
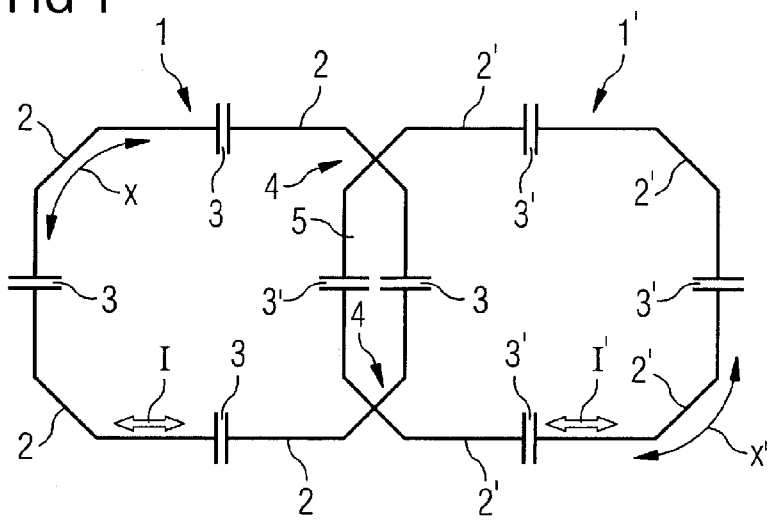
FIG. 1 schematically illustrates an array antenna according to the invention.

As shown in FIG. 1, an array antenna for magnetic resonance applications has a first conductor loop 1 and a second conductor loop 1'. The array antenna can additionally has further conductor loops, an explanation based on the conductor loops 1, 1' is sufficient for understanding the present invention.

In operation of the array antenna radio-frequency currents I, I' oscillate in respective current flow directions x, x' in the conductor loops 1, 1'.

The first conductor loop 1 is divided into first loop segments 2 in its current flow direction x. The first loop segments 2 are capacitively coupled with one another by means of first capacitors 3. In an analogous manner, the second conductor loop 1' is also divided into second loop segments 2' in its current flow direction x'. The second loop segments 2' are also capacitively coupled with one another by means of second capacitors 3'.

The conductor loops 1, 1' intersect in intersection regions 4. They thus exhibit an overlap region 5. The conductor loops 1, 1' can be inductively decoupled from one another due to the overlap region 5.

Figure 2:
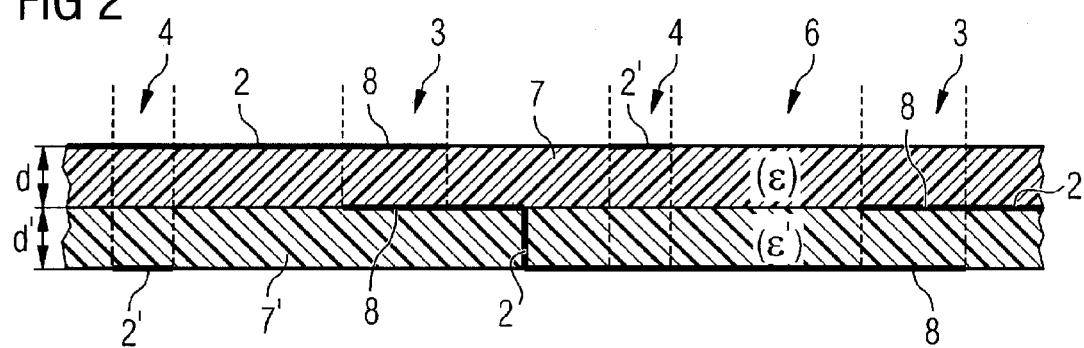

FIG. 2 shows an embodiment of a segment of the array antenna from FIG. 1. According to FIG. 2, the loop segments 2, 2' are fashioned as conductor traces of a circuit board 6. The circuit board 6 has at least one first support layer 7 and one second support layer 7'. Both support layers 7, 7' are electrically insulating. They abut one another with the exception of conductor traces arranged between the support layers 7, 7'. The conductor traces can be the conductor traces that form the loop segments 2, 2', but they can alternatively or additionally be other conductor traces.

The capacitors 3, 3' are respectively formed by end regions 8, 8' of loop segments 2, 2' that abut one another as viewed in the respective current flow direction x, x'. The end regions 8, 8' overlap as viewed in the respective current flow direction x, x'. Precisely one of the support layers 7, 7' is arranged between the overlapping end regions 8, 8' of the loop segments 2, 2'.

By contrast both the first support layer 7 and the second support layer 7' are arranged between the respective loop segment 2 of the first conductor loop 1 and the respective loop segment 2' of the second conductor loop 1' in the intersection regions 4. Neither the respectively loop segment 2 of the first conductor loop 1 nor the respective loop segment 2' of the second conductor loop 1' are arranged between the first and second support layers 7, 7' in the intersection regions 4.

Despite the increased distance of the loop segments 2, 2' from one another in the intersection regions 4, parasitic capacitive coupling of the loop segments 2, 2' with one another exists (if only slightly) in the intersection regions 4. In order to reduce this (unavoidable) parasitic capacitive coupling as much as possible, the loop segments 2, 2' should optimally intersect orthogonally (see FIG. 1).

According to FIG. 2, with regard to at least one of the capacitors 3, 3' the first support layer 7 is arranged between the overlapping end regions 8, 8' of the loop segments 2, 2'. With regard to at least one other of the capacitors 3, 3', according to FIG. 2 the second support layer 7' is arranged between the overlapping end regions 8, 8' of the loop segments 2, 2'. This embodiment is normally useful when the second support layer 7' exhibits a second thickness d' and a second relative permittivity $\epsilon'$ that are equal to the thickness d and the relative permittivity $\epsilon$ of the first support layer 7. This is not absolutely necessary, however, since the capacitance values of the capacitors 3, 3' can be set by the size of the end segments 8, 8'.

Figure 3:
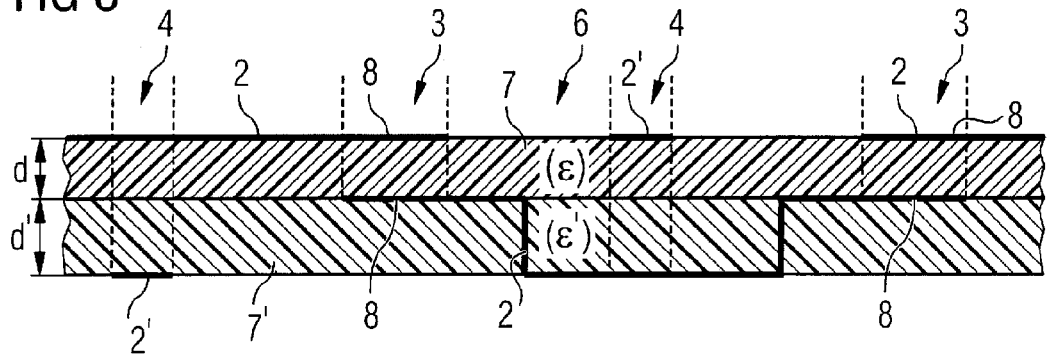

The embodiments of FIGS. 3 through 5 correspond in principle to the embodiment of FIG. 2. The first and the second loop segments 2, 2' are also fashioned as conductor traces of the circuit board 6 in the embodiments according to FIG. 3 through 5. The circuit board 6 also furthermore has at least the first and the second support layers 7, 7'. Furthermore, the support layers 7, 7' likewise abut one another with the exception of the conductor traces arranged between the support layers 7, 7'. Furthermore, the conductor traces can likewise be the loop segments 2, 2' and possibly other conductor traces.

Furthermore, in the embodiments of FIGS. 3 through 5 the capacitors 3, 3' are also respectively formed by end regions 8, 8' of first or, respectively, second loop segments 2, 2' abutting one another as viewed in the respective current flow direction x, x'. The end regions 8, 8' furthermore overlap as viewed in the respective current flow direction x, x'.

As in the embodiment according to FIG. 2, in the embodiments according to FIG. 3 through 5 exactly one of the support layers 7, 7' is arranged between the overlapping end regions of the loop segments 2, 2'. However, in contrast to the embodiment from FIG. 2, the first support layer 7 is always arranged between the overlapping end regions 8, 8' of the loop segments 2, 2' in the embodiments of FIG. 3 through 5.

The embodiments of FIGS. 3 through 5 are in particular reasonable when the thickness d' of the second support layer 7' is greater than the thickness d of the first support layer 7 (see FIGS. 3 and 5). For example, the first thickness d can lie in the range between 20 and 100 μm, the second thickness d' in the range between 500 and 1000 μm. According to a preferred exemplary embodiment, the first thickness d is 50 μm, the second thickness d' 800 μm.

As an alternative (see FIG. 4) or in addition (see FIG. 5) to the embodiment from FIG. 3, it is possible that the relative permittivity $\epsilon'$ of the second support layer 7' is less than the relative permittivity $\epsilon$ of the first support layer 7. For example, the first relative permittivity $\epsilon$ can lie in the range between 8 and 12, the second relative permittivity $\epsilon'$ in the range between 1.5 and 3. According to a preferred exemplary embodiment, the first relative permittivity $\epsilon$ is 10, the second relative permittivity $\epsilon'$ 2.

Furthermore, neither the respective loop segment 2 of the first conductor loop 1 nor the respective loop segment 2' of the second conductor loop 1' is arranged between the first and second support layers 7, 7' in the intersection regions 4. Both support layers 7, 7' are thus arranged between the respective loop segments 2, 2' in the intersection regions 4. In the embodiments according to FIGS. 3 through 5 the loop segments 2, 2' also optimally orthogonally intersect in the intersection regions 4.

Figure 7:
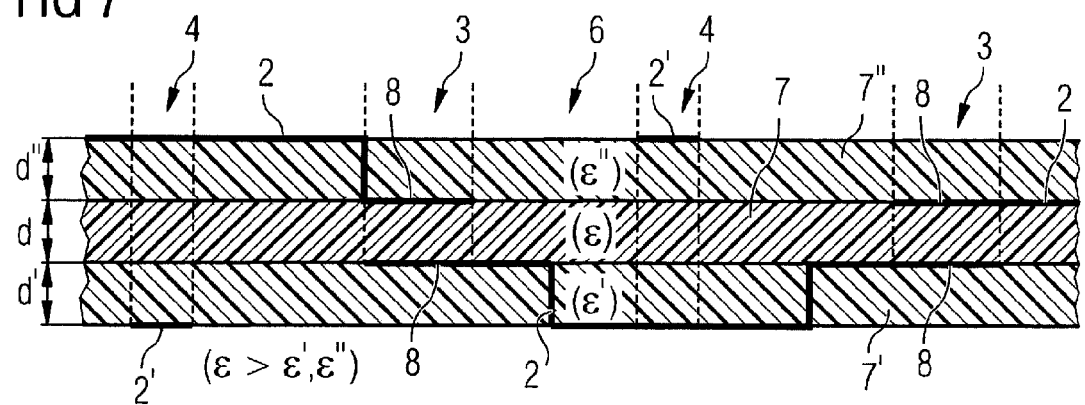
Figure 8:
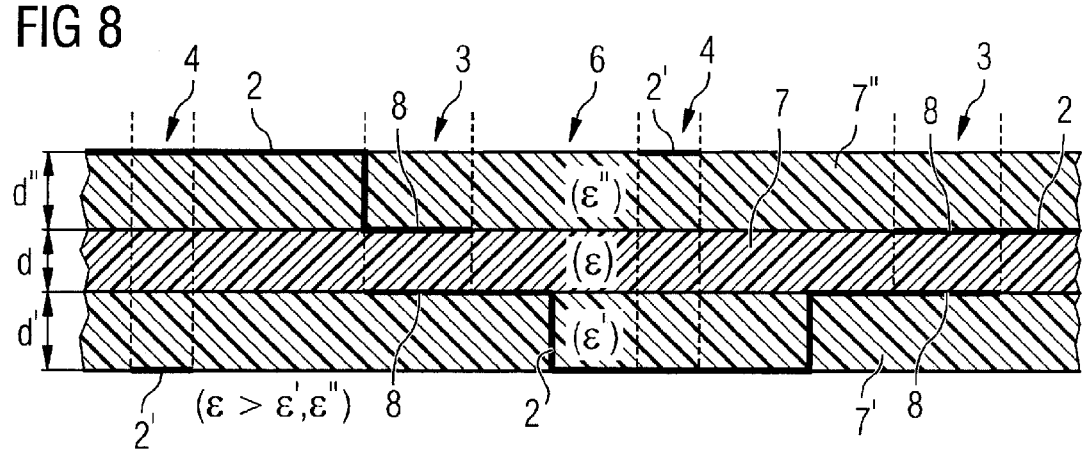

FIG. 6 through 8 show developments of the embodiments of FIGS. 3 through 5. FIG. 6 hereby shows an embodiment of FIG. 3, FIG. 7 shows an embodiment of FIG. 4 and FIG. 8 shows an embodiment of FIG. 5.

According to FIGS. 6 through 8, the circuit board 6 comprises a third support layer 7" in addition to the first and second support layers 7, 7'. The third support layer 7" is also electrically insulating. Analogous to the arrangement of first and second support layer 7, 7' relative to one another, the third support layer 7" furthermore abuts on the first support layer 7 with the exception of conductor traces arranged between the first and the third support layers 7, 7". The conductor traces that possibly run between the first and the third support layers 7, 7" can be the conductor traces 2, 2' which form the loop segments 2, 2'. Alternatively or additionally, however, they can also be other conductor traces.

In the embodiments of FIGS. 6 through 8, parasitic coupling capacitances which the intersecting loop segments 2, 2' form with one another in the intersection regions 4 are even further reduced relative to the embodiments of FIG. 3 through 5. This is achieved by neither the respective loop segment 2 of the first conductor loop 1 nor the respective loop segment 2' of the second conductor loop 1' being between the first support layer 7 and the third support layer 7" in the intersection regions 4. In the embodiments of FIGS. 6 through 8, therefore the respective end segments 8, 8' are arranged between the first and the second support layer 7, 7' as well as between the first and the third support layer 7, 7' to form the capacitors 3, 3', such that only the first support layer 7 is arranged between the end segments 8, 8', and in the intersection regions 4 the loop segments 2, 2' are arranged on the outer sides of the second and third support layer 7, 7' so that all three support layers 7, 7', 7" are arranged between the loop segments 2, 2' in the intersection regions 4.

The provision of the third support layer 7" is useful when the first, the second and the third support layers 7, 7', 7" exhibit identical thicknesses d, d', d" and identical relative permittivities $\epsilon$, $\epsilon'$, $\epsilon''$. However, according to FIGS. 6 and 8 the third support layer 7" advantageously exhibits a third thickness d" that is greater than the first thickness d. The third thickness d" can in particular coincide with the second thickness d'.

As an alternative (see FIG. 7) or in addition (see FIG. 8) to the provision of a greater thickness d", the third support layer 7" can exhibit a third relative permittivity $\epsilon''$ that is smaller than the relative permittivity $\epsilon$ of the first support layer 7. The relative permittivity $\epsilon''$ of the third support layer 7" can coincide with the relative permittivity $\epsilon'$ of the second support layer 7'.

The inventive embodiments exhibit many advantages. For example, it is no longer necessary to use discrete capacitors. The inventive embodiment can therefore on the one hand be manufactured more cost-effectively. A manual assembly is no longer required. The inventive array antenna therefore operates more reliably. Its manufacture can also be automated. Unavoidable parasitic coupling capacitances in the intersection regions 4 can be reduced to a minimum. Crosstalk between the conductor loops 1, 1' is also correspondingly minimized. The inventive embodiment exhibits a high electric strength. The danger of voltage breakdowns is no longer present. The inventive embodiment is particularly advantageous for applications in combination with PET (positron emission tomography). The circuit board 6 can be fashioned not only as a rigid circuit board but also alternatively also as a flexible circuit board. As an alternative or in addition to the embodiment as a flexible circuit board, the circuit board 6 can be curved in two directions differing from one another.

Although modifications and changes may be suggested by those skilled in the art, it is the intention of the inventors to embody within the patent warranted hereon all changes and modifications as reasonably and properly come within the scope of their contribution to the art.

We claim as our invention:

1. An antenna array for magnetic resonance applications, comprising:
    at least one first conductor loop and one second conductor loop in which radio-frequency currents oscillate in respective current flow directions during antenna operation;
    said first conductor loop being divided into a plurality of first loop segments in the current flow direction thereof, and said second conductor loop being divided into second loop segments in the current flow direction thereof;
    said first loop segments being capacity coupled with each other by first capacitors, and said second loop segments being capacity coupled with each other by second capacitors;
    said first loop segments and said second loop segments each being formed as conductor traces of a circuit board, said circuit board comprising a first electrically insulating support layer and a second electrically insulating support layer, said first and second support layers abutting each other except where said conductor traces proceed between said first support layer and said second support layer;
    said first capacitors being formed by end regions of first loop segments that abut each other in the current flow direction of the first conductor loop, and the second capacitors being formed by end regions of second loop segments abutting each other in the current flow direction of the second conductor loop, said end regions forming said first capacitors respectively overlapping the end regions forming said second capacitors with exactly one of said first and second support layers between the overlapping end regions; and
    said first and second conductor loops crossing each other in intersection regions, with neither a first loop segment nor a second loop segment being between the first support layer and the second support layer in said intersection regions.

2. An antenna array as claimed in claim 1 wherein, for at least one of said first or second capacitors, said first support layer is disposed between the respective overlapping end regions of the first and second loop segments and, for the other of said first and second capacitors, the second support layer is disposed between the respective overlapping end regions of the first and second loop segments.

3. An antenna arrangement as claimed in claim 2 wherein said first support layer has a thickness that is equal to a thickness of the second support layer, and a permittivity that is equal to a permittivity of the second support layer.

4. An antenna array as claimed in claim 1 wherein said first support layer is always disposed between the respective overlapping end regions of the first and second loop segments.

5. An antenna array as claimed in claim 4 wherein said first support layer has a first thickness and said second support layer has a second thickness, said second thickness being greater than said first thickness.

6. An antenna array as claimed in claim 4 wherein said first support layer has a first relative permittivity and said second support layer has a second relative permittivity, and wherein said second relative permittivity is less than said first relative permittivity.

7. An antenna array as claimed in claim 4 wherein said circuit board comprises a third electrically insulating support layer, and wherein said first and third support layers abut each other except where said conductor traces proceed between said first and third support layers, and wherein neither a first loop segment nor a second loop segment is disposed between said first support layer and said third support layer in said intersection regions.

8. An antenna array as claimed in claim 7 wherein said first support layer has a first thickness and said third support layer has a third thickness, said third thickness being greater than said first thickness.

9. An antenna array as claimed in claim 7 wherein said first support layer has a first relative permittivity and wherein said third support layer has a third relative permittivity, and wherein said third relative permittivity is less than said first relative permittivity.

* * * * *